United States Patent [19]
Gannage et al.

[11] Patent Number: 5,724,303
[45] Date of Patent: Mar. 3, 1998

[54] NON-VOLATILE PROGRAMMABLE MEMORY HAVING AN SRAM CAPABILITY

[75] Inventors: Michael E. Gannage, Santa Clara; David K. Wong; Asim A. Bajwa, both of San Jose, all of Calif.

[73] Assignee: Nexcom Technology, Inc., Sunnyvale, Calif.

[21] Appl. No.: 601,963

[22] Filed: Feb. 15, 1996

[51] Int. Cl.$^6$ ........................................................ G11C 7/00
[52] U.S. Cl. ........................ 365/238.5; 365/185.23; 365/189.05; 365/230.08
[58] Field of Search .................. 365/238.5, 189.05, 365/230.08, 185.23

[56] References Cited

U.S. PATENT DOCUMENTS

| | | | |
|---|---|---|---|
| 5,347,487 | 9/1994 | Dao et al. | 365/189.05 |
| 5,355,335 | 10/1994 | Katsuno | 365/189.04 |
| 5,361,229 | 11/1994 | Chiang et al. | 365/189.05 |
| 5,535,159 | 7/1996 | Nii | 365/189.05 |

OTHER PUBLICATIONS

Pathak & Baker, Session 7 Overview: Flash Memory, 1995 IEEE International Solid-State Circuits Conference, Feb. 16, 1995, p. 11.

Mills et al., TA 7.1 A3.3V 50MH$_z$ Synchronous 16Mb Flash Memory, 1995 IEEE International Solid-State Circuits Conference, Feb. 16, 1995, pp. 120-121.

Kobayashi et al., TA 7.2 A3.3V-Only 16Mb Dinor Flash Memory, 1995 IEEE International Solid-State Circuits Conference, Feb. 16, 1995, pp. 122-123.

Nozoe et al., TA 7.3: A3.3V High-Density And Flash Memory with 1m/s/512B Erase & Program Time, 1995 IEEE International Solid-State Circuits Conference, Feb. 16, 1995, pp. 124-125.

Cernea et al., TA 7.4 A 34Mb 3.3V Serial Flash EEPROM for Solid-State Disk Applications, 1995 IEEE International Solid-State Circuits Conference, Feb. 16, 1995, pp. 126-127.

Suh et al., TA 7.5 A3.3V 32Mb NAND Flash Memory with Incremental Step Pulse Programming Scheme, 1995 IEEE International Solid-State Circuits Conference, Feb. 16, 1995, pp. 128-129.

Imamiya et al., TA 7.6: A35ns-Cycle Time 3.3V-Only 32Mb NAND Flash EEPROM, Ieee International Solid-State Circuits Conference, Feb. 16, 1995, pp. 130-131.

Bauer et al., TA 7.7: A Multilevel-Cell 32Mb Flash Memory, IEEE International Solid-State Circuits Conference, Feb. 16, 1995, pp. 132-133.

*Primary Examiner*—Son T. Dinh
*Attorney, Agent, or Firm*—David H. Carroll

[57] ABSTRACT

A computer system includes a computing device such as a microcontroller and a memory device. The memory device is illustrively a serial device connected to the serail port of the microcontrollerThe memory device includes a page latch load circuit which provides serial I/O to the microcontroller and transfers I/O bits in a predetermined order to/from the page latches. Page latches are connected over many bit lines to a memory cell array. The page latches not only supports programming and reading of sectors in the memory cell array, but also provides one or more of the following functions: directly accessable to the microcontroller as an SRAM scratch pad, directly loadable from the memory cell array to facilitate single byte "read-modify-write" operations, and loadable during programming operations to support real time applications.

20 Claims, 4 Drawing Sheets

NON-VOLATILE PROGRAMMABLE
MEMORY HAVING AN SRAM CAPABILITY

BACKGROUND

1. Field of the Invention

The present invention related to non-volatile programmable memory, and more particularly to non-volatile programmable memory having SRAM-like (Static Random Access Memory) enhanced capabilities and performance characteristics memories.

2. Background of the Invention

Byte programming for EEPROM (Electrically Erasable-Programmable Read-Only Memory) devices is longer than byte programming for EPROM (Erasable-Programmable Read-Only Memory) or Flash EPROM. In particular, byte programming requires about 5 ms for EEPROM as opposed to about 10 µs for EPROM or Flash EPROM. The reason is that EEPROM devices typically use Fowler-Nordheim Tunneling mechanism to inject electrons or retrieve electrons to or from the floating gate, while EPROM or Flash EPROM devices typically use the CHE (channel hot electron) mechanism to inject electrons in the floating gate. The CHE mechanism is quite inefficient and typically requires anywhere from 100 µA to 1 mA of programming current for each cell. This is why only one byte at a time is usually programmed in EPROM's or FLASH EPROM's devices. On the other hand, the FN (Fowler-Nordheim) tunneling mechanism barely consume any current, being typically in the nanoamphere range. Because of this, many cells, illustratively a few thousand, can be programmed at the same time in parallel.

Because large number of cells can be programmed in parallel, page latches have been widely used in EEPROM devices to speed up their programming time. An early EEPROM device containing page latches is the type 28C64, which is a 64K EEPROM available from various manufacturers including Catalyst and Xicor. Each page latch is connected to a bitline; typically for a given EEPROM device, there are as many page latches as there are bitlines. For example, a 64K EEPROM (type 28C64) has 32 bytes of page latches, a 256K EEPROM (type 28C256) has 64 bytes of page latches, and a 1Mb EEPROM (type 28C010) has 128 bytes of page latches. A serial 8Mbit Flash EEPROM type 26F080 available from Nexcom Technolgy, Inc. of Sunnyvale, Calif. has 536 bytes of page latches.

Page latches typically operate in the following way. The user provides to the memory the column address as well as the data byte followed by $\overline{WE}$ and $\overline{CE}$ to load the page latches. After all the page latches are loaded, the memory device goes into a self-timed programming cycle at the end of which the data in the page latches is transferred to the selected row decoded by the X-Address decoder. The device programming is sped up by a considerable factor. For example, if all 32 bytes are loaded in the page latches, the programming time per byte is cut from an average of 5 ms to 5 ms/32 or 156 µs. For an 8 Mbit device having 2048 sectors of 536 bytes each, the average programming time is 5 ms/536 bytes or about 9 µs.

A page latch has some features in common with an SRAM cell. For example, both page latches and SRAM cells typically includes two inverters connected back-to-back. However, page latches and SRAM cells have many differences as well. For example, SRAM cells are differential devices, while page latches are single ended. As a differential device, an SRAM cell is able to interact with high capacitance differential bit lines without affecting the value stored therein. However, as a single ended device, a page latch is not able to interact with a high capacitance line without potentially changing the value stored therein. While a page latch can be used as temporary storage before transferring data to a selected row of memory, a page latch is not usable as a data buffer.

One-transistor Flash EEPROM devices containing page latches have a further weakness, relative to regular EEPROM devices. Regular EEPROM devices, which contain two transistor memory cells, use a byte-select transistor for every byte, so that every byte is uniquely accessible. Eight page latches are associated with every byte, and an additional page latch is associated with the byte select. If only one byte needs to be modified, the modification can be easily achieved because only that byte will go through the Erase & Write cycle. However, Flash EEPROM devices using one-transistor memory cells have no byte-select transistors. If only one byte needs to be modified, the entire sector is erased (high threshold voltage $V_t$) and is subsequently entirely written. Typically, if a "Read-Modify-Write" operation is desired, the entire sector is read and stored in external RAM, the selected byte is modified, and the entire sector is loaded back into the page latches before the self timed Erase-Write Operation is initiated. Unfortunately, this process is time-consuming.

Memory devices containing page latches have a further weakness, which is problematical in some real time applications requiring continuous writes to memory. During programming of a sector in which data is transferred from the page latches to the selected sector, the page latches cannot be accessed until the sector programming is complete. Typically, a self-timed programming cycle takes about 5 ms. In a real time application generating sectors of data more frequently than once ever 5 ms, an external memory device must be used to temporarily store the stream of real time data until programming of the present sector is complete.

SUMMARY OF THE INVENTION

These and other disadvantages in the background of the present invention are variously addressed in the several embodiments of the present invention. One such embodiment is a non-volatile programmable memory integrated circuit that comprises a plurality of data I/O nodes; a plurality of page latches respectively coupled to the data I/O nodes, each of the page latches being loadable and readable through a respective one of the data I/O nodes; a plurality of bit lines respectively coupled to the page latches; a plurality of word lines; and a memory array having a plurality of non-volatile erasable-programmable memory cells coupled to respective pairs of the word lines and bit lines.

Another such embodiment is a non-volatile programmable memory integrated circuit comprising a page latch having a static random access memory element with first and second data nodes, the second data node being a complement of the first data node; a load path coupled to one of the first and second data nodes; and a sense path coupled to one of the first and second data nodes. A bit line is coupled to one of the first and second data nodes, and an erasable-programmable non-volatile memory cell is selectively coupled to the bit line.

Another such embodiment is a method of operating a memory having a plurality of erasable-programmable non-volatile memory cells selectively accessed by a plurality of word lines to provide data on a plurality of bit lines. The method comprises selecting a subset of the non-volatile memory cells associated with a word line of the memory; loading stored data directly from the selected subset of the erasable-programmable non-volatile memory cells into a plurality of static random access memory ("SRAM") elements respectively coupled to the bit lines and integrated into the memory; updating the stored data in the SRAM elements; and writing the updated stored data from the SRAM elements into the selected subset of the erasable-programmable non-volatile memory cells.

DETAILED DESCRIPTION OF THE PREFERRED EMBODIMENT

Figure 1:
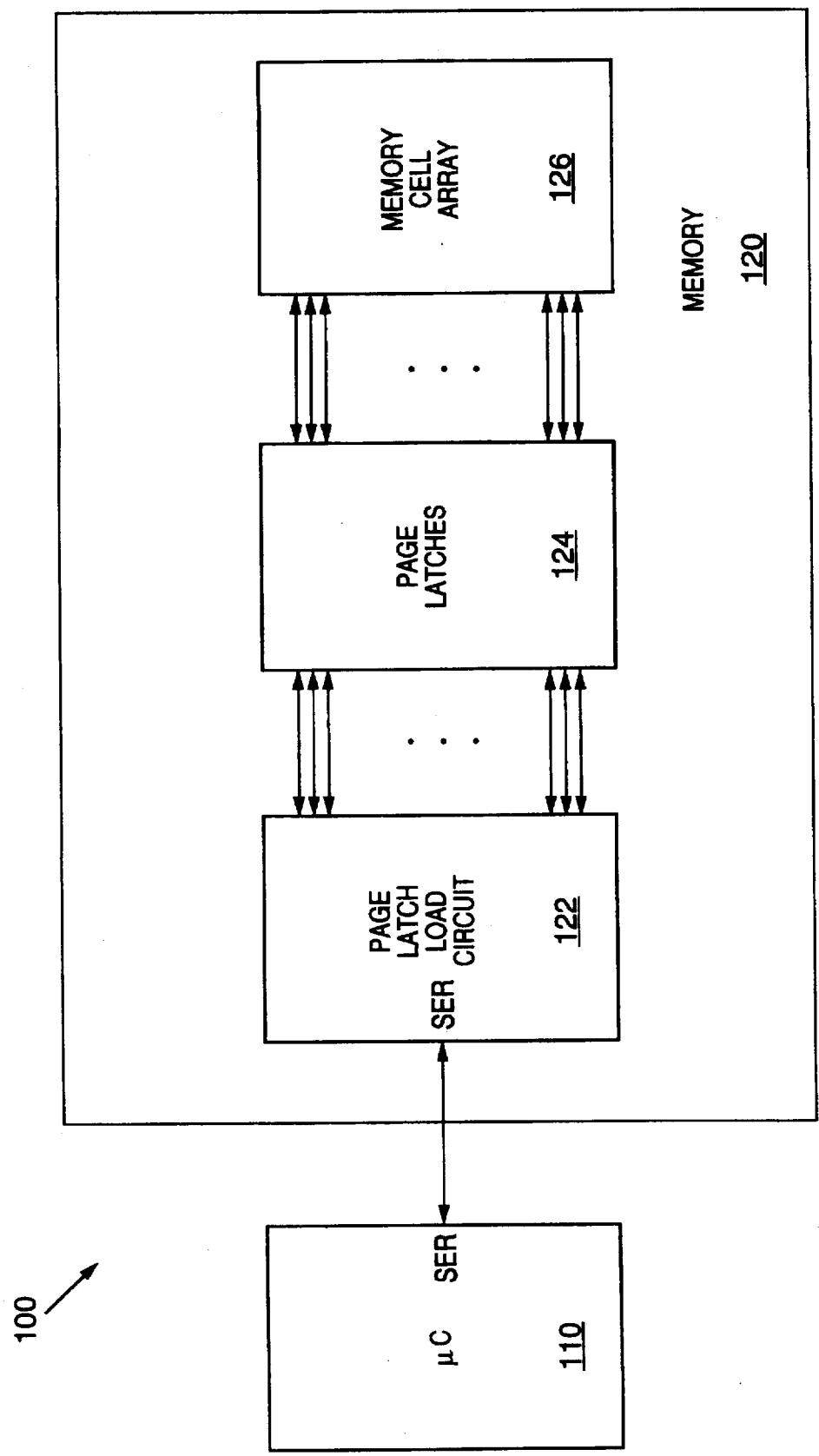
FIG. 1 is a block schematic diagram of a computer system.

FIG. 1 shows an illustrative computer system 100 which includes a computing device such as a microcontroller 110 (other computing devices such as microprocessors, controllers and processors are suitable as well) and a memory device 120. The memory device 120 is illustratively a serial device connected to the serial port of the microcontroller 110, although a parallel memory device connected to the microcontroller 110 by a bus may be used if desired. The memory device 120 includes a page latch load circuit 122, which typically includes a shift register, which provides serial I/O to the microcontroller 110 and transfers I/O a byte at a time in a predetermined order to/from the page latches 124. Page latches 124 is connected over many bit lines to a memory cell array 126. Page latches 124 not only supports programming and reading of sectors in the memory cell array 126, but also provides one or more of the following functions: directly accessable to the microcontroller 110 as an SRAM scratch pad, directly loadable from the memory cell array 126 to facilitate single byte "read-modify-write" operations, and loadable during programming operations to support real time applications.

These various embodiments of the page latches 124 are described herein in further detail. Various circuits and methods for the page latch load circuit 122, the memory cell array 126, and other elements of the memory device 120 (omitted for clarity) are described in U.S. Pat. No. 5,414,658, which is entitled "Electrically Erasable Programmable Read-Only Memory Array" and issued May 9, 1995 to Challa et at. and which is incorporated herein by reference in its entirety; U.S. Pat. No. 5,410,680, which is entitled "Solid State Memory Device Having Serial Input/Output" and issued Apr. 25, 1995 to Challa et al. and which is incorporated herein by reference in its entirety; U.S. Pat. No. 5,291,584, which is incorporated herein by reference in its entirety; and U.S. Pat. No. 5,222,040, which is entitled "Single Transistor EEPROM Memory Cell" and issued Jun. 22, 1993 to Challa and which is incorporated herein by reference in its entirety. A variety of other circuits and methods for the page latch load circuit 122, the memory cell array 126, and other memory device elements may be suitable as well.

Figure 2:
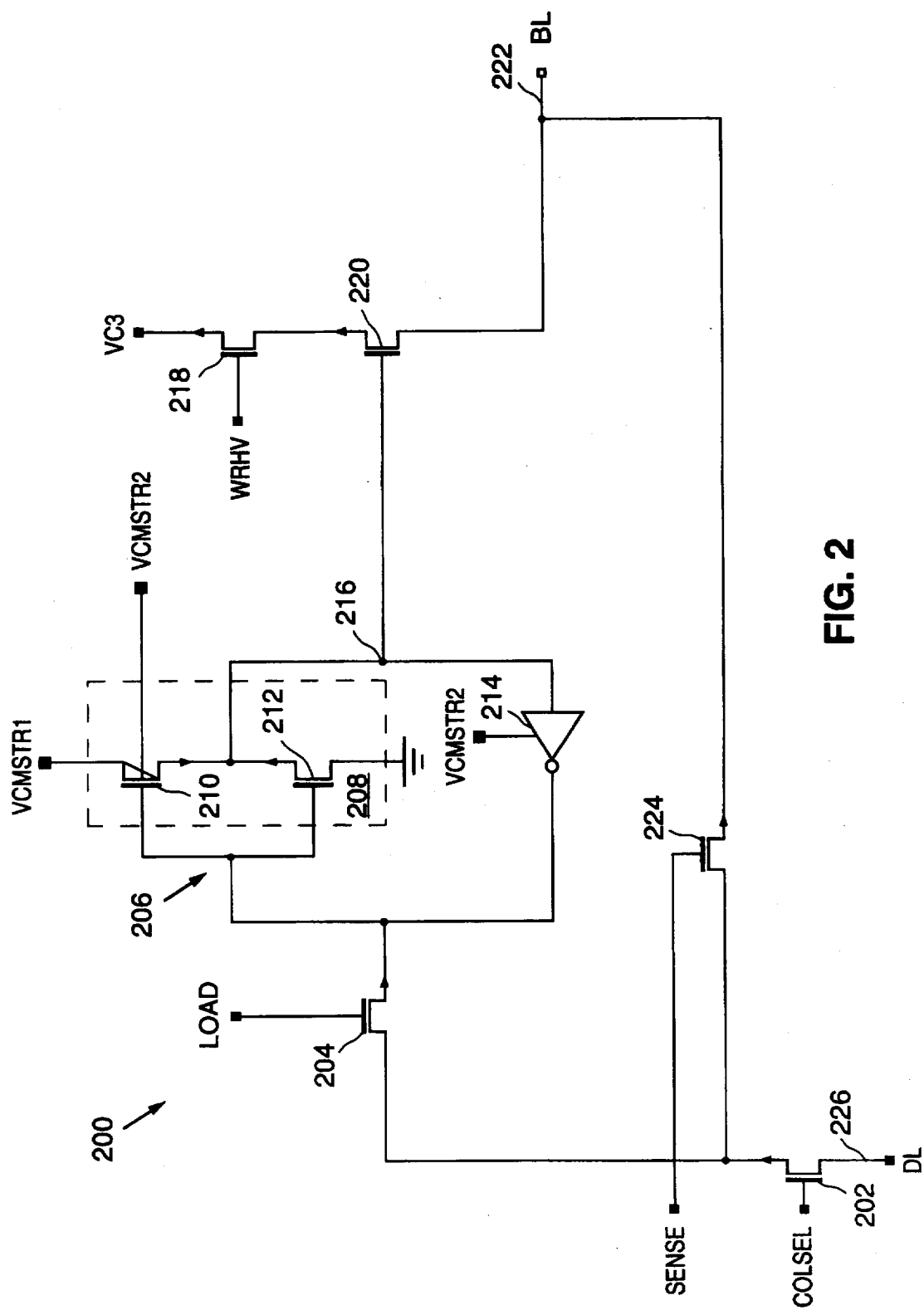
FIG. 2 is a schematic diagram of a page latch circuit.

FIG. 2 shows a page latch 200 that is writable as well as readable, and is in effect an SRAM and is capable of supporting functions normally supported by SRAMs. One application is as an SRAM scratch pad for systems that need extra SRAM. For example, this is particularly useful for microcontroller systems in which the use of external SRAM is not desired. For example, the type 8051 microcontroller usually has either 128 bytes or 256 bytes of internal SRAM, but this amount of SRAM may not be enough. Hence, page latches such as 200 made internal to an EEPROM provide useful additional functionality to the overall system.

In the page latch 200 of FIG. 2, transistor 202 is a column select transistor and transistor 204 is a load transistor. Inverters 208 and 214 are connected back-to-back to implement a volatile memory element 206. Each inverter includes two transistors connected in a conventional manner; for example, inverter 208 includes a p-type transistor 210 and an n-type transistor 212. The N-wells of the inverters 208 and 214 are tied to VCMST2. Transistor 218 is switched by signal WRHV and is used to provide a suitable voltage $V_{C3}$ for writing to the array or reading from the page latch 200. Transistor 220 provides isolation so that the content of the volatile memory element 206 is not disturbed when read. Transistor 224 is a sense transistor.

The page latch 200 operates as follows. To load the page latch 200 with a "1" or a "0", COLSEL goes to $V_{CC}$ and LOAD goes to $V_{CC}$. If a "0" state is loaded then node 216 is "1" and if "1" state is loaded then node 216 is "0." During erase, the word line (not shown) of the addressed sector goes high, and after erase the addressed memory cell connected to the bit line 222 is in a high $V_T$ state ("1" state). To write to the addressed sector of the memory array involves transferring the contents of all page latches into the selected sector. Illustratively, the various signals applied to the page latch 200 during a write operation are as follows: WRHV is a "1" state, $V_{C3}$ is 4V, and the word line of the selected sector (not shown) is minus 11V. If node 216 is at a "1" state, tunneling occurs in the memory cell associated with the page latch 200 and having minus 11V on its gate and 4V on its drain, so that the memory cell goes into a low $V_T$ (state "0"). If node 216 is at a "0" state, then the bit line 222 floats to "0" so that tunneling does not occur in the memory cell associated with the page latch 200 and the memory cell stays at the high $V_T$ achieved by the ERASE operation.

The memory cell associated with the page latch 200 is read as follows. Illustratively, the various signals applied to the page latch 200 during a read operation are as follows: WRHV is a "0" state (illustratively zero volts), LOAD is zero volts, SENSE is $V_{CC}$, COLSEL is $V_{CC}$, the bit line 222 is 1.5 volts, and the word line of the selected sector (not shown) is about 3V. If the memory cell is in a low $V_T$ state, then the sense amplifier associated with the page latch 200 and connected to node DL (data line) will detect a "0" and current flows from the sense amplifier into the memory cell. Otherwise, the memory cell is off and the Sense Amp detects a "1" state.

The page latch 200 is read as follows. Illustratively, the various signals applied to the page latch 200 during a read operation are the same as for reading a memory cell associated with the page latch 200, except that the word lines of the memory array are turned off (zero volts or minus 1V, for example). WRHV is $V_{CC}$, and $V_{C3}$ is zero volts. If node 216 is in a "1" state, then the sense amplifer indicates a "0" state by detecting current flowing from the sense amplifier into $V_{C3}$. If node 216 is in a "0" state, then the sense amplifer indicates a "1" state by detecting no current flowing.

Figure 3:
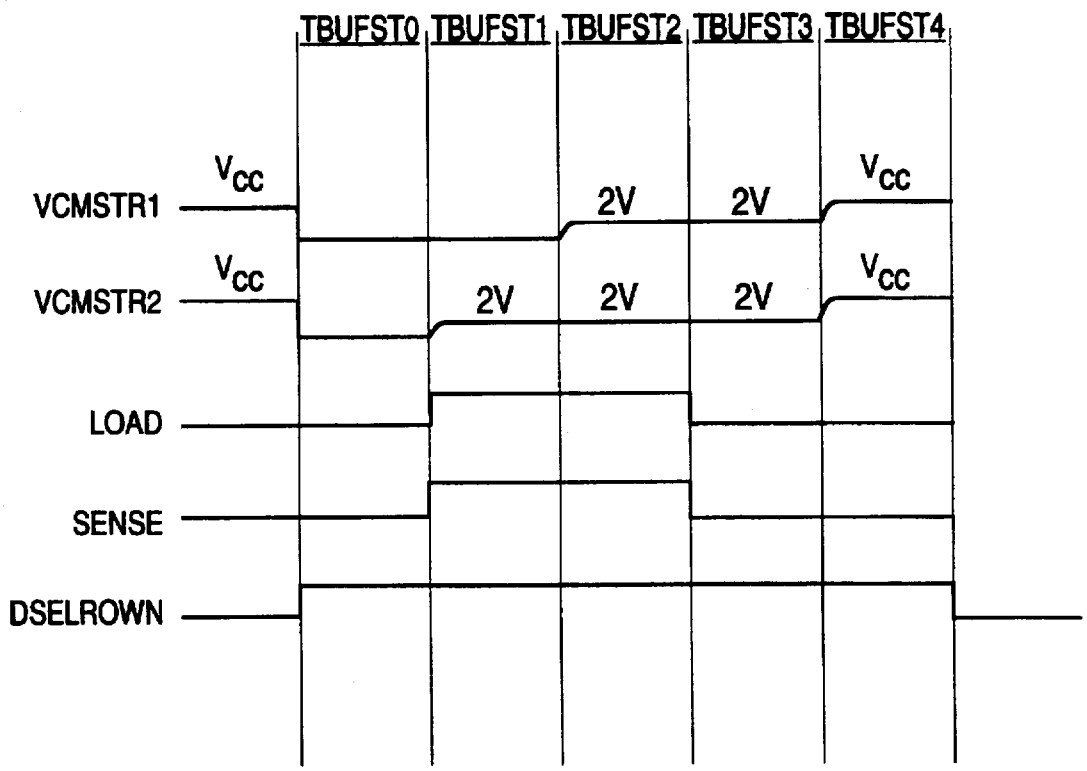
FIG. 3 is a timing diagram for the page latch of FIG. 2.

The page latch of FIG. 2 also supports a direct transfer of the contents of an addressed sector of a memory array into the page latches of the memory array, which enables a rapid read-modify-write of one byte of the memory array. Illustratively, the sequence and values of the various signals applied to the page latch 200 during a direct-from-memory load operation are illustrated in FIG. 3. During period TBUFST0, both inverters 208 and 214 are powered down by bringing VCMSTR1 and VCMSTR2 from $V_{CC}$ to zero volts. The row deselect signal DSELROWN (active low) is also raised high in period TBUFST0. During period TBUFST1, the bitline 222 is biased to about two volts by raising VCMSTR2 to about 2 volts to power up the weak inverter 214. At this time, both LOAD and SENSE are raised high so that a current path is established through transistors 204 and 224 to the bit line 222. If the memory cell associated with the page latch 200 is on, then the bit line 222 is pulled low. Otherwise, the bit line remains at about 2 volts. During period TBUFST2, VCMSTR1 is raised to about 2 volts to power up the stronger inverter 208 and latch the logical value on the bit line 222 into the volatile cell 206. During period TBUFST3, both LOAD and SENSE are lowered to zero volts to decouple the bit line 222 from the volatile cell 206. During period TBUFST4, both VCMSTR1 and VCMSTR2 are raised to $V_{CC}$ to strongly latch the stored value.

The sequence illustrate in FIG. 3 has the further advantage of avoiding power glitches from simultaneously switching a large number of page latches, which could improperly change the state stored in the volatile cell 206. This is achieved by raising VCMSTR1 and VCMSTR2 initially to about 2 volts in the sequence shown to latch the proper value into the volatile cell 206, then by raising VCMSTR1 and VCMSTR2 to $V_{CC}$ to strongly latch the stored value.

Figure 4:
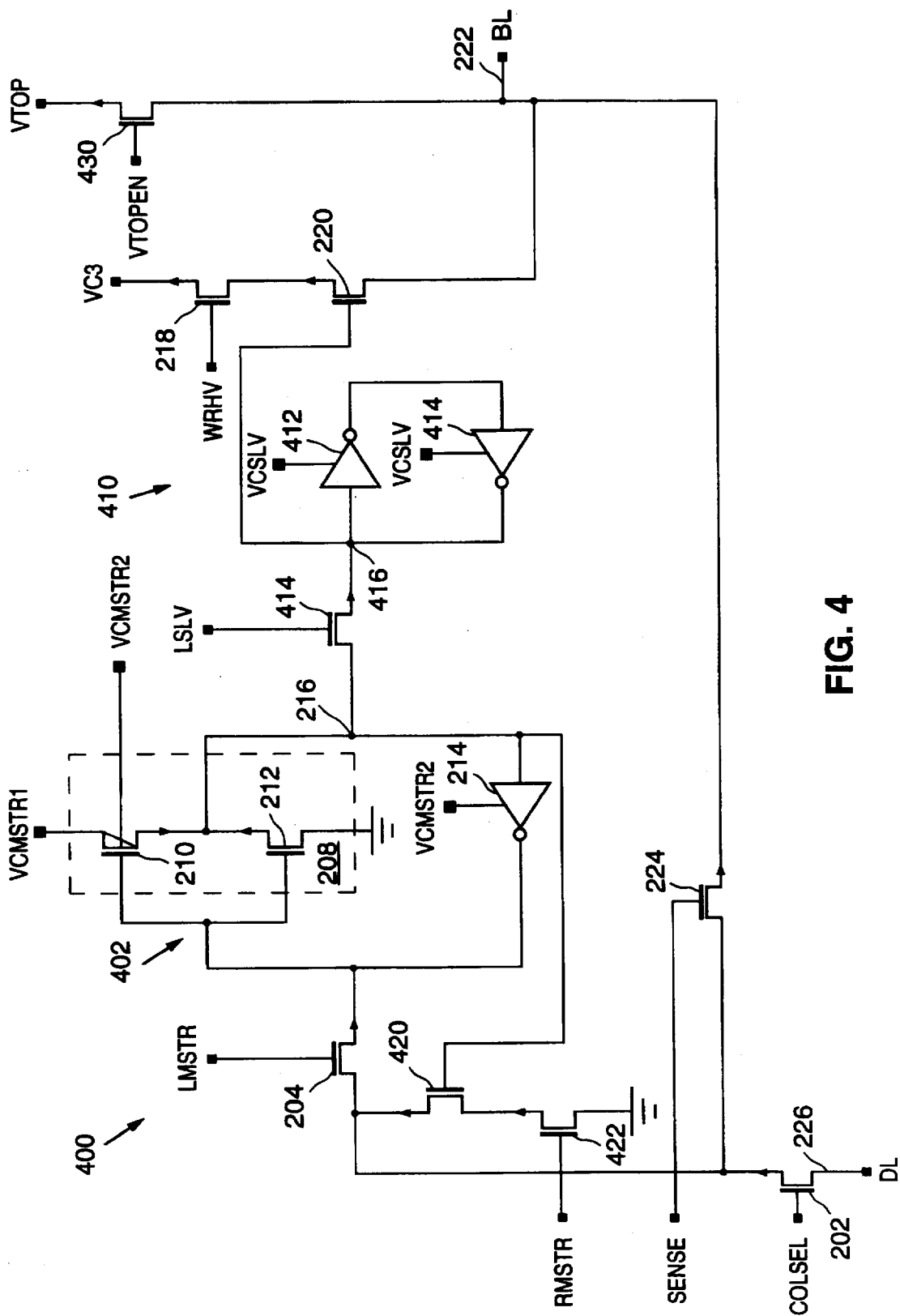
FIG. 4 is a schematic diagram of a page latch circuit.

FIG. 4 shows a page latch 400 that is waltable as well as readable, and in addition includes a slave stage so that data can be transferred to the page latch 400 or read from the page latch 400 even while prior data is being written into the memory array. The page latch 400 includes the elements of the page latch 200 of FIG. 2, but in addition includes elements to implement a slave stage 410 and the ability to read or write from a master stage 402. Transistor 404 controls the transfer of the value stored in the master stage 402 to the slave stage 410. The slave stage 410 includes inverters 412 and 414, which are connected back-to-back to implement a volatile memory element. Transistor 422 is switched by signal RMSTR and is used to provide a suitable voltage, in this case reference or zero volts, for reading from the master stage 402. Transistor 420 provides isolation so that the content of the volatile first stage 402 is not disturbed when read.

In the page latch 400 of FIG. 4, the master stage 402 is loaded from the external interface. Just before programming, the contents of the master stage 402 is transfered into the slave stage 410. In the memory, the transfer of all the page latches to all of the slave stages occurs in parallel. The slave stage controls bit line biasing during the programming mode.

The page latch 400 operates as follows. Preferably, the master stages of the page latches of the memory are loaded one byte at a time, from the dataline 226. To load the master stage 402 with a "1" or a "0", illustratively COLSEL is high ($V_{CC}$). SENSE is low (zero volts), read master signal RMSTR is low, load master signal LMSTR is high, load slave signal LSLV is low, and $V_{CMSTR1}$ and $V_{CMSTR2}$ are $V_{CC}$. If a "0" state is loaded then node 216 is "1" and if "1" state is loaded then node 216 is "0."

Preferably, the master stages of the page latches of the memory are read one byte at a time using the eight sense amplifiers. To read the master stage 402, illustratively COLSEL is high, RMSTR is high, LMSTR is low, SENSE is low, LSLV is low, and $V_{CMSTR1}$ and $V_{CMSTR1}$ are $V_{CC}$. If "0" were loaded from the data line 226, node 216 would be a "1" and the sense ampilfer connected to the data line 226 would sense "0".

Preferably, the transfer of data from the master stages to the slave stages of the page latches of the memory is done for all of the bytes in the sector at one time, illustratively 536 bytes at a time for an 8 Mbit device. To avoid big $I_{CC}$ glitches that would disturb the master and slave stages of the page latches, power down techniques are used in the master-to-slave transfer operation. To perform a master-to-slave transfer, illustratively the following sequence is used. First, power down the inverters 412 and 414 of the slave stage 410 by lowering $V_{CSLV}$ from $V_{CC}$ to zero volts. Next, slowly ramp up LSLV and $V_{CSLV}$ toward $V_{CC}$. Then, when $V_{CC}$ is reached, change LSLV to zero volts to isolate the slave stage 410 from the master stage 402 while maintaining $V_{CSLV}$ at $V_{CC}$.

Preferably, the slave stages of the page latches of the memory are read one byte at a time using the eight sense amplifiers. To read the slave stage 410, illustratively COLSEL is high, RMSTR is low, LMSTR is low, SENSE is high, LSLV is low, WRHV is high, $V_{C3}$ is zero volts, and $V_{CSLV1}$ and $V_{CSLV2}$ are $V_{CC}$. If "0" were loaded from the data line 226, node 416 would be "1" and the sense amplifer connected to the data line 226 would sense "0".

The page latch 400 of FIG. 4 also supports a direct transfer of the contents of an addressed sector of a memory array into the master stages of the page latches of the memory array, which enables a rapid read-modify-write of one byte of the memory array.

The description of the invention set forth herein is illustrative, and does not limit the scope of the invention as set forth in the following claims. Variations and modifications of the embodiments disclosed herein are possible. For example, the particular voltage values set forth herein are illustrative, but do establish relationships that enable or disable Fowler-Nordheim tunneling and reading of the memory cells. Moreover, the sizes of the various transistors shown in the figures are illustrative; other values may be used consistent with the operation of the page latches described herein. Moreover, typically in Flash EEPROM, sector is the same a word line. These and other variations and modifications of the embodiments disclosed herein may be made without departing from the scope and spirit of the invention.

What is claimed is:

1. A non-volatile programmable memory integrated circuit comprising:
    a plurality of data input/output ("I/O") nodes;
    a plurality of page latches respectively coupled to the data I/O nodes, each of the page latches being loadable and readable through a respective one of the data I/O nodes;
    a plurality of bit lines respectively coupled to the page latches;
    a plurality of word lines; and
    a memory array having a plurality of non-volatile erasable-programmable memory cells coupled to respective pairs of the word lines and bit lines.

2. A memory as in claim 1 wherein each of the page latches is a single stage static random access memory cell.

3. A memory as in claim 1 wherein each of the page latches comprises a master stage and a slave stage, each of the master stages being a static random access memory cell loadable and readable through a respective one of the data nodes coupled thereto, and each of the slave stages being loadable from a respective one of the master stages and readable through a respective one of the data nodes coupled thereto.

4. A non-volatile programmable memory integrated circuit comprising:
a page latch having;
a first static random access memory element with first and second data nodes, the second data node being a complement of the first data node;
a first load path coupled to one of the first and second data nodes; and
a first sense path coupled to one of the first and second data nodes;
a bit line coupled to one of the first and second data nodes; and
an erasable-programmable non-volatile memory cell selectively coupled to the bit line.

5. A memory as in claim 4 wherein the first static random access memory element comprises back-to-back connected inverters.

6. A memory as in claim 4 wherein the page latch further comprises a data input/output ("I/O") node and load and sense control elements, wherein;
the first load path includes the load control element and is coupled at one end to the first data node and at another end to the data I/O node;
the first sense path includes the sense control element and is coupled at one end to the second data node and at another end to the data I/O node; and
the bit line is coupled to the second data node.

7. A memory as in claim 4 wherein the page latch further comprises:
a second static random access memory element with third and fourth data nodes, the fourth data node being a complement of the third data node; and
a second load path coupled to one of the third and fourth data nodes;
and wherein the first load path is coupled to one of the third and fourth data nodes.

8. A method of operating a memory having a plurality of erasable-programmable non-volatile memory cells selectively accessed by a plurality of word lines to provide data on a plurality of bit lines, comprising:
selecting a first subset of the non-volatile memory cells associated with a first word line of the memory;
loading stored data directly from the first subset of the erasable-programmable non-volatile memory cells into a plurality of first static random access memory ("SRAM") elements respectively coupled to the bit lines and integrated into the memory;
updating the stored data in the first SRAM elements; and
writing the updated stored data from the first SRAM elements into the first subset of the erasable-programmable non-volatile memory cells.

9. A method as in claim 8 wherein the step of writing the updated stored data comprises writing the updated stored data from the first SRAM elements directly into the first subset of the erasable-programmable non-volatile memory cells.

10. A method as in claim 8 wherein the step of writing the updated stored data comprises:
writing the updated stored data from the first SRAM elements directly into a plurality of second SRAM elements respectively coupled to the first SRAM elements, the first SRAM elements being master elements and the second SRAM elements being slave elements; and
writing the updated stored data directly from the second SRAM elements into the first subset of the erasable-programmable non-volatile memory cells.

11. A method as in claim 10 further comprising, subsequent to the step of writing the updated stored data from the first SRAM elements directly into a plurality of second SRAM elements, the step of writing new data into the first SRAM elements at least in part concurrently with the step of writing the updated stored data directly from the second SRAM elements into the first subset of the erasable-programmable non-volatile memory cells.

12. A method as in claim 11 further comprising reading the new data from the first SRAM elements, concurrently with the step of writing the updated stored data directly from the second SRAM elements into the first subset of the non-volatile memory cells.

13. A memory as in claim 7 wherein the page latch further comprises a data input/output ("I/O") node, first and second load control elements, and a sense control element, wherein:
the first load path includes the first load control element and is coupled at one end to the first data node and at another end to the fourth data node;
the second load path includes the second load control element and is coupled at one end to the third data node and at another end to the data I/O node; and
the first sense path includes the sense control element and is coupled at one end to the second data node and at another end to the data I/O node.

14. A memory as in claim 7 further comprising a second sense path coupled to one of the third and fourth data nodes.

15. A memory as in claim 14 wherein the page latch further comprises a data input/output ("I/O") node, first and second load control elements, and first and second sense control elements, wherein:
the first load path includes the first load control element and is coupled at one end to the first data node and at another end to the fourth data node;
the second load path includes the second load control element and is coupled at one end to the third data node and at another end to the data I/O node;
the first sense path includes the first sense control element and is coupled at one end to the second data node and at another end to the data I/O node;
the second sense path includes the second sense control element and is coupled at one end to the fourth data node and at another end to the data I/O node; and
the bit line is coupled to the second data node.

16. A method of operating the memory of claim 4, comprising:
loading a value into the first static random access memory element via the first load path;
copying the value from the first static random access memory element to the erasable-programmable non-volatile memory cell via the bit line; and
reading the value from the first static random access memory element via the first sense path.

17. A method of operating the memory of claim 7, comprising:
loading a first value into the first static random access memory element from the second static random access memory element via the first load path;
copying the first value from the first static random access memory element to the erasable-programmable non-volatile memory cell via the bit line; and
loading a second value into the second static random access memory element via the second load path, after the first value loading step and at least in part during the copying step.

18. A memory as in claim 6 wherein:

the first static random access memory element comprises first and second back-to-back connected inverters, the second inverter being weak relative to the first inverter; and the bit line is coupled to the second node through an isolation circuit to prevent voltage levels on the bit line from affecting a logical state stored in the first static random access memory element.

19. A method of operating the memory of claim 18, comprising:

powering down the first and second inverters;

selecting the erasable-programmable non-volatile memory cell to read a stored logical value stored therein;

biasing the load and sense control elements to close the first load path and the first sense path;

weakly powering up the second inverter to furnish current to the bit line through the closed first load path and the closed first sense path, the bit line being pulled low when the erasable-programmable non-volatile memory cell is on and weakly charging to a second voltage when the erasable-programmable non-volatile cell is off to establish a voltage level indicative of the stored logical value;

weakly powering up the first inverter to latch a latched logical value into the first static random access memory element in accordance with the voltage level on the bit line;

biasing the load and sense control elements to open the first load path and the first sense path, thereby decoupling the first static random access memory element from the erasable-programmable non-volatile memory cell; and strongly powering up the first and second inverters to strongly latch the latched logical value into the first static random access memory element.

20. A memory as in claim 4 wherein the bit line is coupled to one of the first and second data nodes and the first sense path is coupled to one of the first and second data nodes through a commonly shared isolation circuit to prevent voltage levels on the bit line and on the first sense line from affecting a logical state stored in the first static random access memory element.

* * * * *

UNITED STATES PATENT AND TRADEMARK OFFICE
CERTIFICATE OF CORRECTION

PATENT NO. : 5,724,303
DATED : March 3, 1998
INVENTOR(S) : Gannage et al.

It is certified that error appears in the above-indentified patent and that said Letters Patent is hereby corrected as shown below:

On the title page, item [56], under U.S. PATENT DOCUMENTS and immediately after the line beginning "5,535,159" insert the following U.S. Patent Documents:

|   |   |   |   |
|---|---|---|---|
| -- 5,291,584 | 3/1994 | Challa et al. | 395/500 |
| 5,414,658 | 5/1995 | Challa | 365/185.06 |
| 5,222,040 | 6/1993 | Challa | 365/185.24 |
| 5,410,680 | 4/1995 | Challa et al. | 395/500 -- |

Column 3, line 50, change "at." to -- al.--.

Column 4, line 14, change "VCMST2" to --VCMSTR2--.

Signed and Sealed this

Sixteenth Day of June, 1998

Attest:

BRUCE LEHMAN

*Attesting Officer*  *Commissioner of Patents and Trademarks*